United States Patent
Lin et al.

(10) Patent No.: US 7,616,445 B2
(45) Date of Patent: Nov. 10, 2009

(54) STRUCTURE AND METHOD FOR EFFICIENT THERMAL DISSIPATION IN AN ELECTRONIC ASSEMBLY

(75) Inventors: Yao-Nan Lin, Taipei (TW); Hsin-Yu Cheng, Taipei (TW)

(73) Assignee: NVIDIA Corporation, Santa Clara, CA (US)

( * ) Notice: Subject to any disclaimer, the term of this patent is extended or adjusted under 35 U.S.C. 154(b) by 68 days.

(21) Appl. No.: 11/858,748

(22) Filed: Sep. 20, 2007

(65) Prior Publication Data

US 2009/0080162 A1    Mar. 26, 2009

(51) Int. Cl.
*H05K 7/20* (2006.01)
(52) U.S. Cl. .................. 361/719; 361/690; 361/704; 174/16.1; 174/16.3; 165/80.3
(58) Field of Classification Search .......... None
See application file for complete search history.

(56) References Cited

U.S. PATENT DOCUMENTS

| | | | | |
|---|---|---|---|---|
| 6,114,761 A | * | 9/2000 | Mertol et al. | 257/722 |
| 6,661,660 B2 | * | 12/2003 | Prasher et al. | 361/700 |
| 6,707,676 B1 | * | 3/2004 | Geva et al. | 361/719 |
| 6,883,592 B2 | * | 4/2005 | Lee | 165/80.3 |
| 7,286,361 B2 | * | 10/2007 | Yamanaka | 361/704 |
| 7,319,588 B2 | * | 1/2008 | Peng et al. | 361/700 |
| 7,468,890 B2 | * | 12/2008 | Lin | 361/720 |
| 2007/0091578 A1 | * | 4/2007 | Chang et al. | 361/719 |

* cited by examiner

*Primary Examiner*—Boris L Chervinsky
(74) *Attorney, Agent, or Firm*—Patterson & Sheridan, LLP

(57) ABSTRACT

One embodiment of the present invention sets forth an electronic assembly, which comprises a printed circuit board having at least one opening, an electronic component mounted on a first side of the printed circuit board, and a thermal dissipation structure including at least one heat sink having a first surface and a second surface. The first surface includes a first region coupled with a surface of the electronic component, and one or more second region provided with at least a heat dissipating member that is exposed through the opening on a second side of the printed circuit board.

20 Claims, 8 Drawing Sheets

STRUCTURE AND METHOD FOR EFFICIENT THERMAL DISSIPATION IN AN ELECTRONIC ASSEMBLY

BACKGROUND OF THE INVENTION

1. Field of the Invention

The present invention generally relates to electronic assemblies, and more particularly to a structure and method for efficient thermal dissipation in an electronic assembly.

2. Description of the Related Art

Unless otherwise indicated herein, the approaches described in this section are not prior art to the claims in this application and are not admitted to be prior art by inclusion in this section.

As the semiconductor technology advances, integrated circuit chips of higher processing power are integrated in computer systems. Nowadays, certain computer systems may typically include a central processing unit ("CPU") in charge of the general computing operations, and one or more graphics processing unit ("GPU") specifically dedicated to process graphics data to render display images. As a result of the increased processing power provided by the CPU and the GPU, a higher amount of heat that is produced must be dissipated.

To illustrate, FIG. 1 is a simplified side view showing a conventional motherboard assembly 100. The motherboard assembly 100, which is constructed according to the standard Advanced Technology Extended ("ATX") form, may include a motherboard 102, a CPU 104, and a graphics card 110 having a GPU 112 thereon. To dissipate the heat produced by the CPU 104, a fan module 106 is arranged on the CPU 104. Because the GPU 112 has to be mounted on a side opposite the CPU 104 to comply with the ATX form standard, the dissipation of heat irradiated by the GPU 112 may be problematic. For example, an airflow A generated by the fan module 106 cannot be directly used to dissipate the heat irradiated from the GPU 112. In case an additional electronic assembly 108 is connected to the motherboard 102 in front of the GPU 112, the circulation of the heat irradiated from the graphics card 110 may thus be substantially restrained in proximity of the GPU 112, which would cause overheating damages to the GPU 112.

To remedy the aforementioned problems, a conventional approach proposes to couple a heat sink 114 with the GPU 112, as shown in FIG. 1. The heat sink 114 includes an extended portion 116 that bends over an outer edge of the graphics card 110 for receiving the cooling airflow A. This approach intends to dissipate the heat from the GPU 112 via the extended portion 116 of the heat sink 114 that is exposed to the airflow A. Unfortunately, the designed thermal dissipation path "L" from the GPU 112 to the extended portion 116 is too long, and the heat is mostly dissipated toward the front of the heat sink 114. The designed extended portion 116 of the heat sink 114 consequently provides poor thermal dissipation results. In the presence of another electronic assembly 108, the heat dissipated from the heat sink 114 thus still remains blocked on the same side of the graphics card 110 in proximity of the GPU 112.

What is needed in the art is thus a structure and method that can efficiently dissipate the heat in an electronic assembly and address at least the problems set forth above.

SUMMARY OF THE INVENTION

The present application describes a structure and a method for efficient thermal dissipation in an electronic assembly. Specifically, one embodiment of the present invention sets forth a thermal dissipation structure, which comprises at least one heat sink including a first surface and a second surface. The first surface includes a first region configured to couple with a surface of an electronic component, and one or more second region adjacent to the first region and provided with at least a heat dissipating member configured to facilitate the removal of heat from the electronic component.

In another embodiment of the present invention, an electronic assembly is disclosed. The electronic assembly comprises a printed circuit board having at least one opening, an electronic component mounted on a first side of the printed circuit board, and a thermal dissipation structure including at least one heat sink having a first surface and a second surface. The first surface includes a first region coupled with a surface of the electronic component, and one or more second region provided with at least a heat dissipating member that is exposed through the opening on a second side of the printed circuit board.

In still another embodiment, a method of fabricating an electronic assembly that facilitates the dissipation of heat is disclosed. The method comprises forming at least one opening through a printed circuit board, mounting an electronic component on a first side of the printed circuit board, and coupling a heat sink including at least a heat dissipating member with the electronic component, wherein the heat dissipating member is exposed through the opening on a second side of the printed circuit board.

At least one advantage of the present invention disclosed herein is the ability to dissipate the heat generated in the electronic assembly on two opposite sides of the electronic assembly in a cost effective and efficient manner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
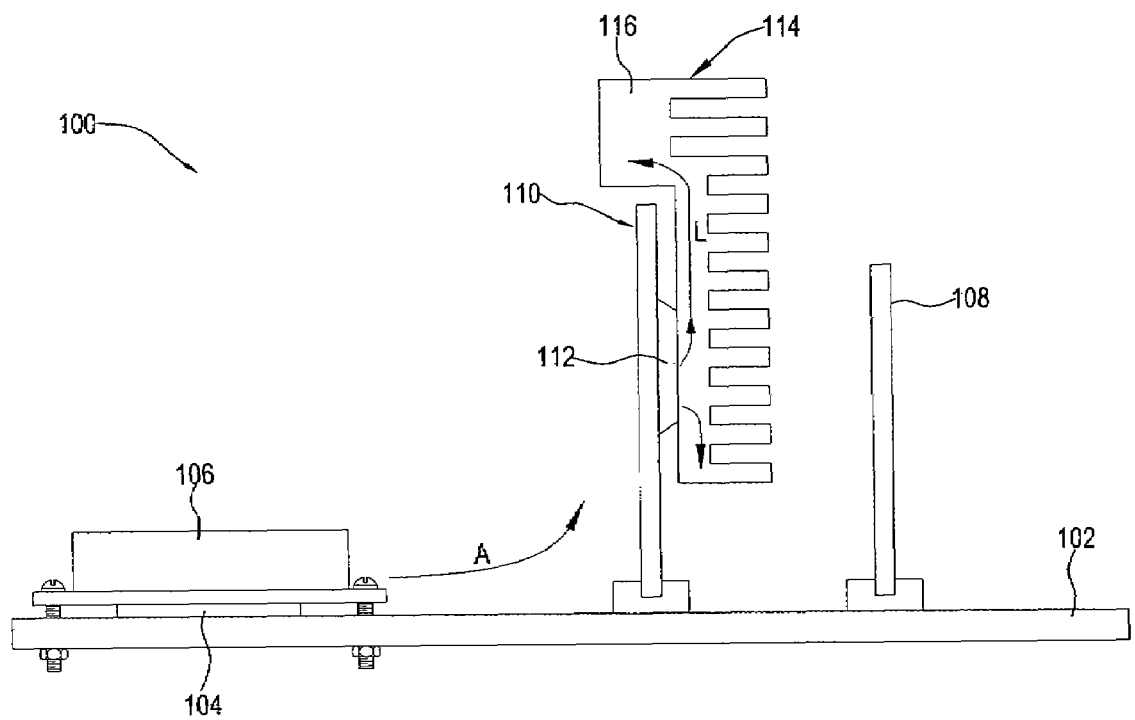
FIG. 1 is a simplified diagram illustrating a conventional placement of an electronic component in a motherboard assembly.
Figure 2A:
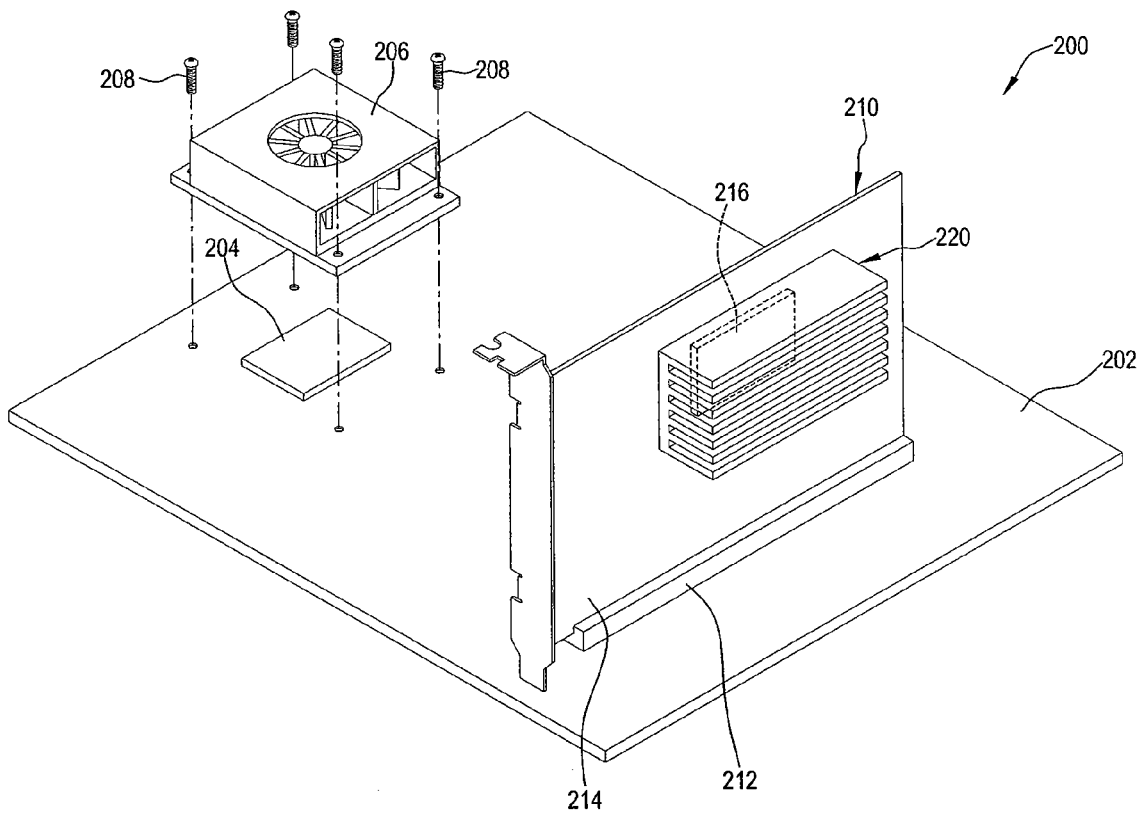
FIG. 2A is a simplified perspective view of a motherboard assembly that implements one or more aspects of the present invention.

FIG. 2A is a simplified perspective view of a motherboard assembly 200 that implements one or more aspects of the present invention. The motherboard assembly 200 includes a motherboard 202, a CPU 204 and an electronic assembly, such as a graphics card 210, mounted on the motherboard 202. The CPU 204 executes programming instructions stored in a system memory (not shown), operates on data stored in the system memory, and communicates with the graphics card 210. To cool down the CPU 204, a cooler fan module 206 placed over the CPU 204 is fixedly secured to the motherboard 202 via fastener screws 208.

The graphics card 210 is assembled on the motherboard 202 via a connection port 212, such as an Accelerated Graphics Port ("AGP"), which connects the graphics card 210 to the CPU 204. The graphics card 210 includes a printed circuit board 214, and a GPU 216 mounted on one side of the printed circuit board 214 that is opposite to the side of the fan module 206. The GPU 216, which may include one or more integrated circuit chip, receives instructions transmitted from the CPU 204, and processes the instructions in order to render graphics data into images stored in a local memory (not shown) provided on the graphics card 210. To dissipate the heat generated by the operation of the GPU 216, a heat sink 220 is placed on the GPU 216. The heat sink 220 may be securely attached to the printed circuit board 214 via fastener elements (not shown).

Figure 2B:
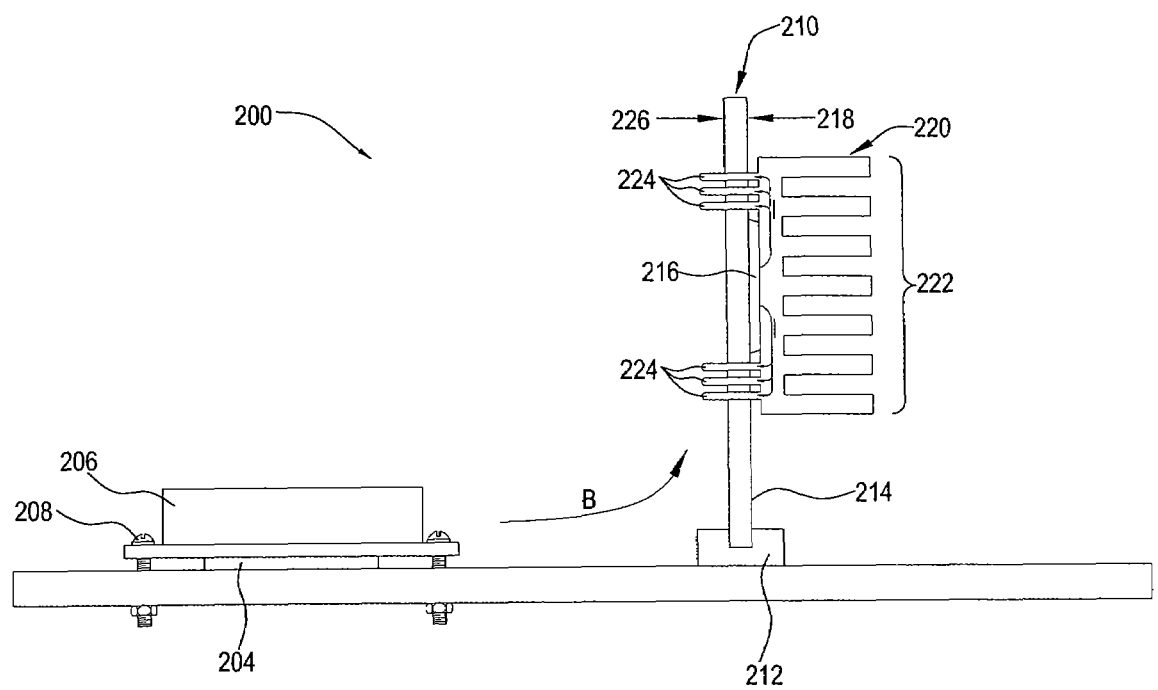
FIG. 2B is a simplified side view of the motherboard assembly shown in FIG. 2A.

To further illustrate the configuration of the heat sink 220 on the graphics card 210, FIG. 2B is a simplified side view of the motherboard assembly 200 shown in FIG. 2A. To dissipate the heat from the GPU 216, the heat sink 220 includes a plurality of fin plates 222 that are substantially exposed on a first side 218 of the printed circuit board 214, and a plurality of heat dissipating members 224 that pass through openings in the printed circuit board 214 to be exposed on an opposing side 226 of the printed circuit board 214. Though each of the heat dissipating members 224 is shown as having a stick-like shape, any shape configuration in general may be implemented. In operation, the heat generated from the GPU 216 can be dissipated along the fin plates 222 on the first side 218 of the printed circuit board 214. In addition, a heat dissipation path "I" in the heat sink 220 also passes along each of the heat dissipating members 224, which are exposed on the opposing side 226 of the printed circuit board 214 to a cooling airflow B generated by the fan module 206. As the heat dissipating members 224 are arranged in areas adjacent to the GPU 216, the heat dissipation path "I" via the heat dissipating members 224 is shortened to provide an efficient thermal dissipation on the opposing side 226 of the printed circuit board 214.

Figure 2C:
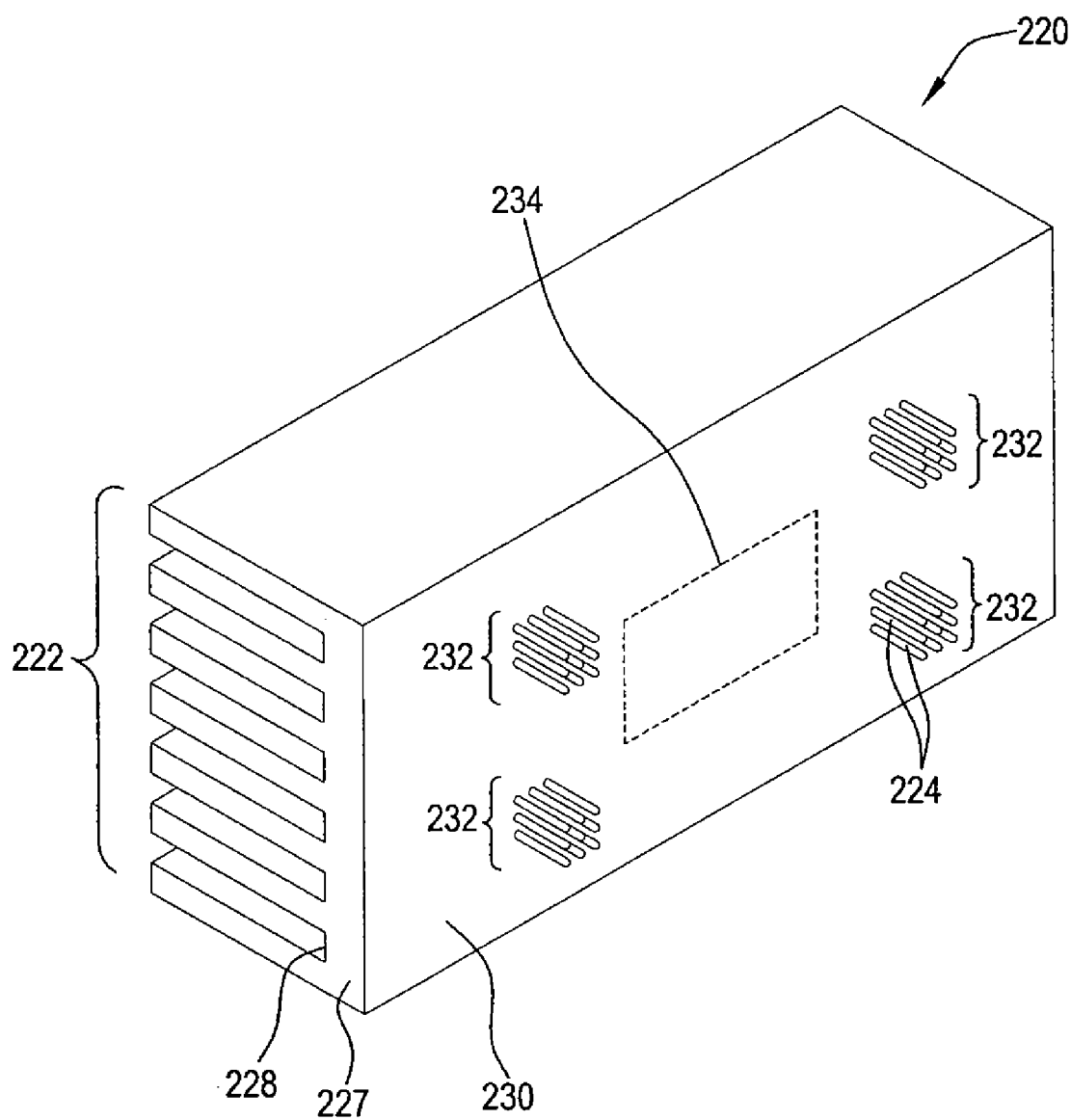
FIG. 2C is a perspective view of a heat sink configured according to an embodiment of the present invention.

In conjunction with FIG. 2B, FIG. 2C is a perspective view of the heat sink 220 according to an embodiment of the present invention. The heat sink 220 includes a base 227 having a first surface 228 from which the fin plates 222 protrude, and a second surface 230 opposite the first surface 228 where are arranged the heat dissipating members 224. The heat sink 220 may be integrally made in a single body, including materials such as copper (Cu), aluminum (Al), graphite composite, and like thermally conductive materials. The heat dissipating members 224 are grouped in spaced apart sets 232 that are distributed on the second surface 230 in regions adjacent to a GPU region 234 adapted to receive the placement of the GPU 216. Though the illustrated example shows an array arrangement for each set 232 of heat dissipating members 224, other distribution patterns may also be implemented. The distance between the GPU region 234 and each adjacent set 232 of heat dissipating members 224 may be set smaller than the distance between the assembled GPU 216 and any outer boundary edge of the printed circuit board 214. In this manner, the heat dissipation path "I" from the GPU 216 to the heat dissipating members 224 can be effectively shortened.

Figure 2D:
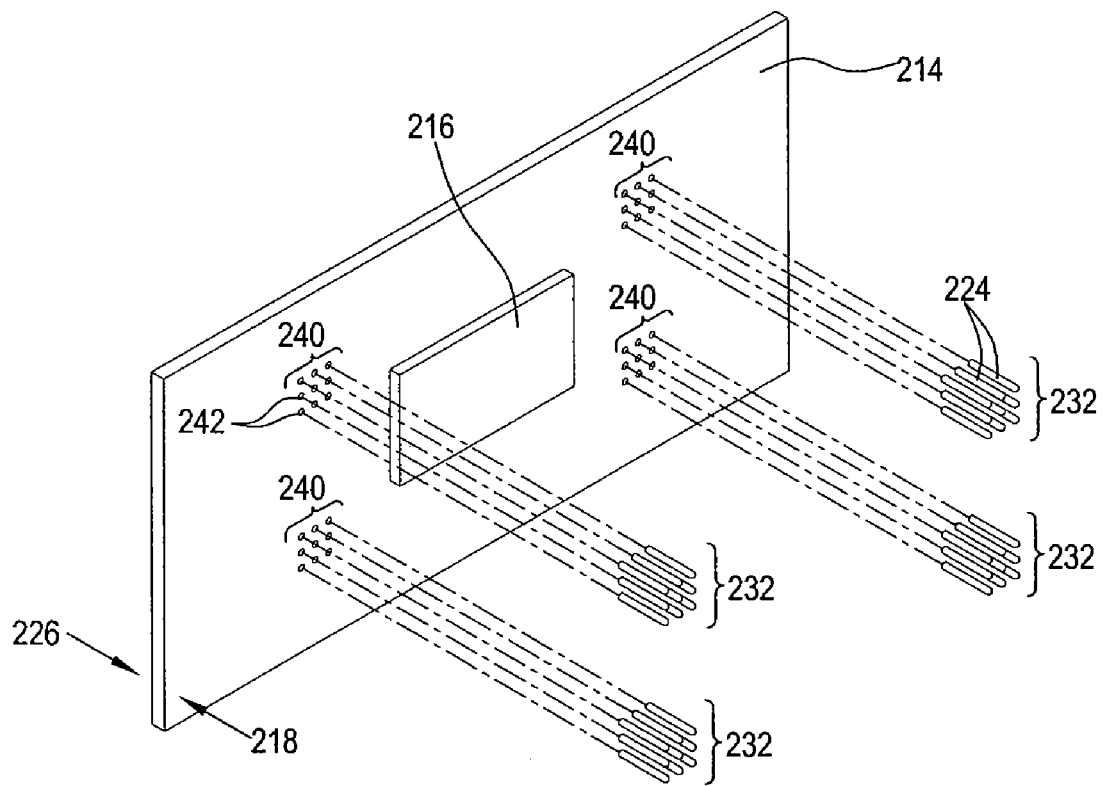
FIG. 2D is a perspective view illustrating how a heat sink provided with heat dissipating members is assembled in an electronic assembly according to an embodiment of the present invention.

FIG. 2D is a perspective view illustrating how the printed circuit board 214 is configured to receive each set 232 of heat dissipating members 224 according to an embodiment of the present invention. To expose the heat dissipating members 224 on the opposing side 226 of the printed circuit board 214, one set 240 of openings 242 may be bored through the printed circuit board 214 for each set 232 of heat dissipating members 224, so that each heat dissipating member 224 passes through one individual opening 242.

Figure 2E:
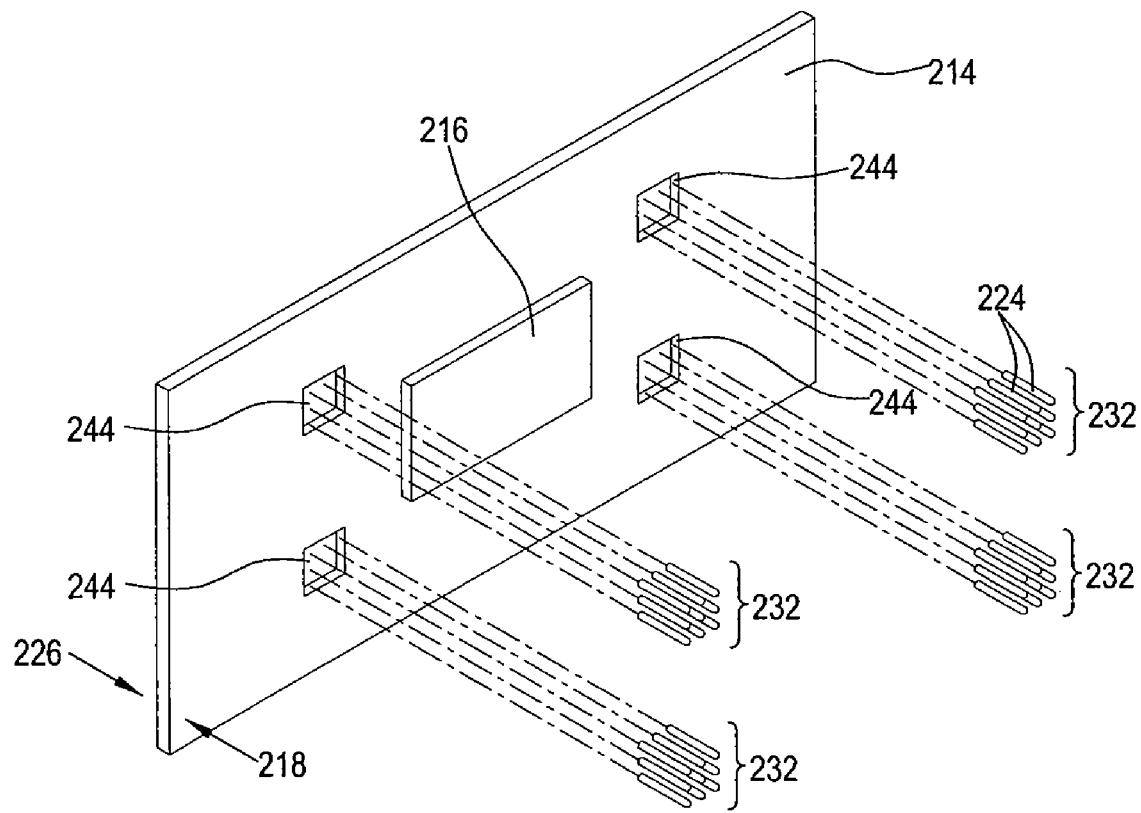
FIG. 2E a perspective view illustrating how a heat sink provided with heat dissipating members is assembled in an electronic assembly according to another embodiment of the present invention.

FIG. 2E is a perspective view showing another embodiment for exposing the heat dissipating members 224 on the opposing side 226 of the printed circuit board 214 according to the present invention. Instead of passing each heat dissipating member 224 through an individual opening, a larger window opening 244 may be cut through the printed circuit board 214 to receive and expose each entire set 232 of heat dissipating members 224.

Figure 3:
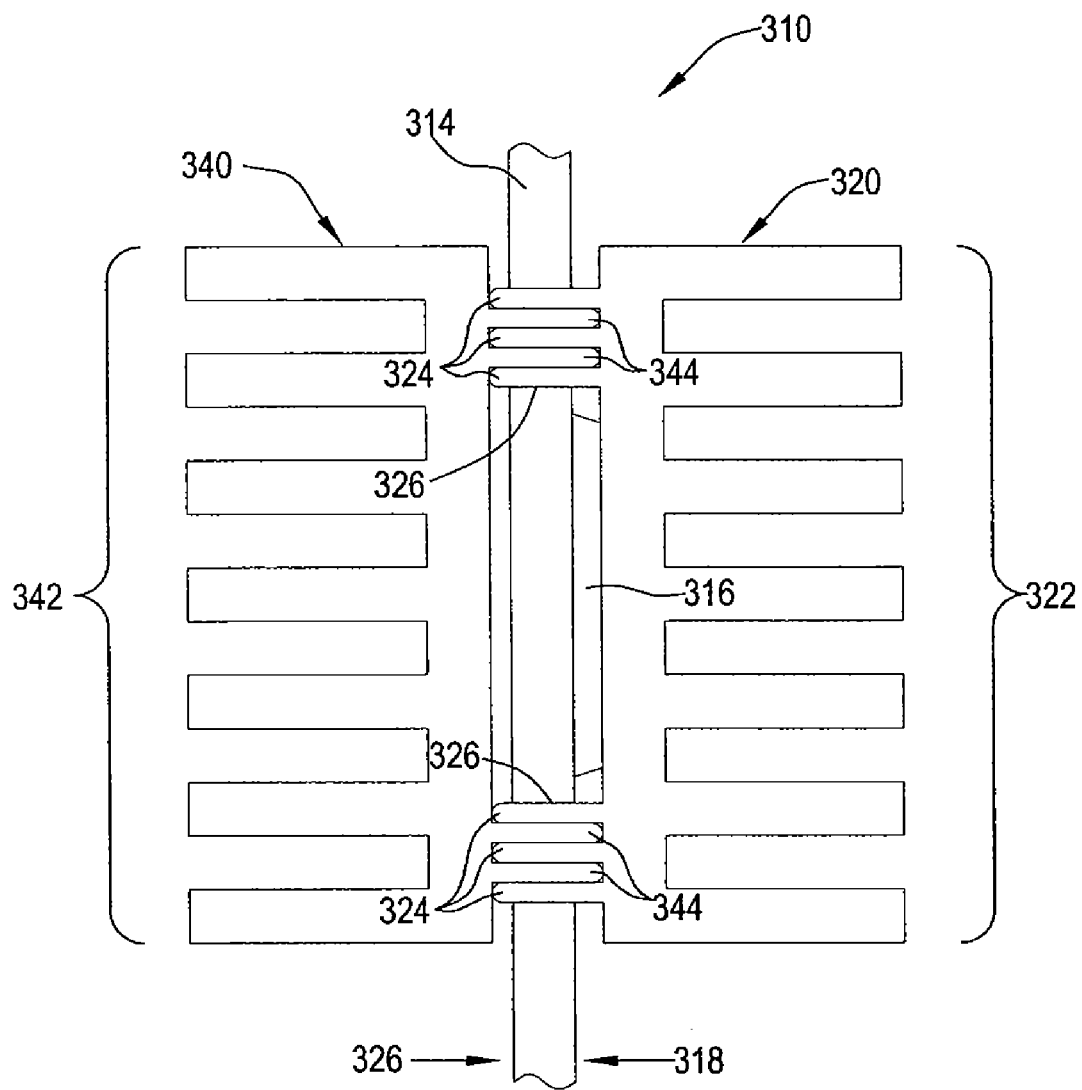
FIG. 3 is a simplified side view of an electronic assembly including a heat sink according to another embodiment of the present invention.

FIG. 3 is a partial side view of a graphics card 310 including a heat sink configuration according to another embodiment of the present invention. Like the previous embodiment, the graphics card 310 includes a printed circuit board 314 having a GPU 316 mounted on a first side 318 of the printed circuit board 314, and a heat sink 320 coupled to the GPU 316. The heat sink 320 includes fin plates 322 exposed on the first side 318, and heat dissipating members 324 that are exposed through window openings 326 in the printed circuit board 314 on a second side 326 of the printed circuit board 314 opposite the first side 318. To further increase the efficiency of the heat dissipation, another heat sink 340 may be attached to the heat sink 320 on the second side 326 of the printed circuit board 314. More specifically, the second heat sink 340 includes heat dissipating portions 344 that are attached to the heat dissipating members 324 of the heat sink 320 via a thermally conductive bonding material, which may be in the form of glue or paste. The heat sink 340 may also include a plurality of fin plates 342 to facilitate the transfer of heat to the surrounding air environment by convection. To reduce the path of heat transfer between the two heat sinks 320 and 340, the heat dissipating members 324 and 344 may be formed with shorter lengths.

Figure 4:
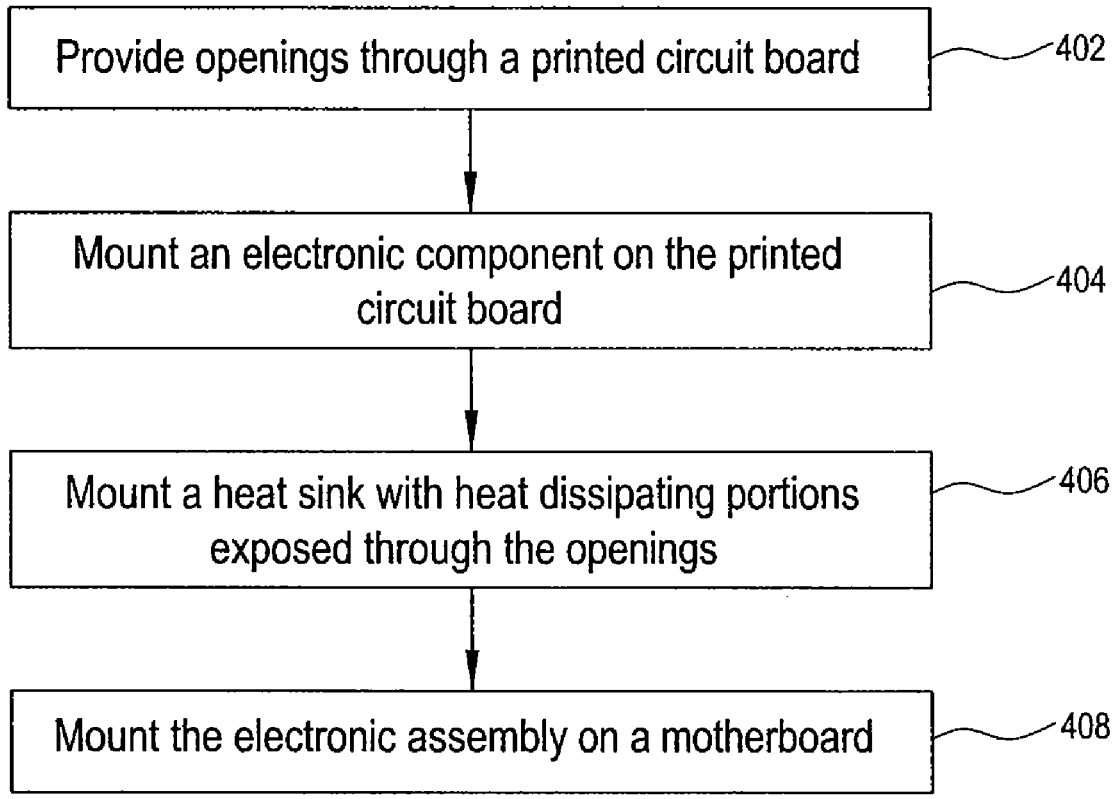
FIG. 4 is a flowchart of method steps for fabricating an electronic assembly according to one or more aspects of the present invention.

FIG. 4 is a flowchart of the method steps for fabricating an electronic assembly according to an embodiment of the present invention. In conjunction with FIGS. 2A-2E, in initial step 402, one or more opening is formed through the printed circuit board 214. Various configurations of the openings, such as an individual opening 242 or a larger window opening 244, have been described. In step 404, an electronic component, such as the GPU 216, then is mounted on the first side 218 of the printed circuit board 214 adjacent to the position of the opening. In step 406, the heat sink 220 then is coupled to the GPU 216, with the heat dissipating members 224 exposed through the openings in the printed circuit board 214 on the opposing side 226. In addition, a second heat sink 340 may be also attached on the opposing side 226?, as shown in FIG. 3. In step 408, the completed electronic assembly 210 then may be mounted on the motherboard 202, with the heat dissipating members 224 adapted to receive the airflow B produced by the fan module 206 on the motherboard 202.

As has been described above, the structure and method described herein are thus able to dissipate the heat generated in an electronic assembly on two opposite sides of the electronic assembly in a cost effective and efficient manner.

The above description illustrates various embodiments of the present invention along with examples of how aspects of the present invention may be implemented. The above examples, embodiments, instruction semantics, and drawings should not be deemed to be the only embodiments, and are presented to illustrate the flexibility and advantages of the present invention as defined by the following claims.

We claim:

1. A thermal dissipation structure comprising:
   at least one heat sink including a first surface and a second surface,
      wherein the first surface includes a first region configured to couple with a first surface of an electronic component mounted on a first side of a printed circuit board, and one or more second regions adjacent to the first region and provided with at least one heat dissipating member exposed on a second side of the printed circuit board through an opening in the printed circuit board,
      wherein the heat dissipating member is configured to facilitate the removal of heat from the electronic component, and
      wherein the heat sink and the printed circuit board substantially enclose the electronic component.

2. The thermal dissipation structure of claim 1, wherein the heat dissipating member includes a stick-shaped protrusion.

3. The thermal dissipation structure of claim 1, wherein the second surface includes a plurality of protruding fin plates.

4. The thermal dissipation structure of claim 1, wherein the electronic component includes an integrated circuit chip.

5. The thermal dissipation structure of claim 1, wherein each second region includes an array of heat dissipating members.

6. The thermal dissipation structure of claim 1, further including another heat sink attached to the heat dissipating member.

7. An electronic assembly comprising:
   a printed circuit board having at least one opening;
   an electronic component mounted on a first side of the printed circuit board; and
   a thermal dissipation structure including at least one heat sink having a first surface and a second surface,
      wherein the first surface includes a first region coupled with a surface of the electronic component, and one or more second regions provided with at least one heat dissipating member that is exposed through the opening on a second side of the printed circuit board, wherein the heat sink and the printed circuit board substantially enclose the electronic component.

8. The electronic assembly of claim 7, wherein the heat dissipating member passes through the opening.

9. The electronic assembly of claim 7, wherein the heat dissipating member includes a stick-shaped protrusion.

10. The electronic assembly of claim 7, wherein the second surface includes a plurality of protruding fin plates.

11. The electronic assembly of claim 7, wherein the electronic component includes an integrated circuit chip.

12. The electronic assembly of claim 7, wherein each second region includes an array of heat dissipating members.

13. The electronic assembly of claim 7, wherein the thermal dissipation structure further includes another heat sink mounted on the second side of the printed circuit board.

14. The electronic assembly of claim 13, wherein the other heat sink on the second side of the printed circuit board is attached to the heat dissipating member.

15. A motherboard assembly comprising the electronic assembly of claim 7, and a fan module operable to generate a cooling airflow toward the heat dissipating member.

16. A method of fabricating an electronic assembly, the method comprising:
   forming at least one opening through a printed circuit board;
   mounting an electronic component on a first side of the printed circuit board; and
   coupling a heat sink including at least one heat dissipating member with the electronic component, wherein the heat dissipating member is exposed through the opening on a second side of the printed circuit board, and the heat sink and the printed circuit board substantially enclose the electronic component.

17. The method of claim 16, wherein coupling the heat sink with the electronic component includes passing the heat dissipating member through the opening.

18. The method of claim 16, further including mounting the printed circuit board on a motherboard having a fan module, wherein the heat dissipating member is oriented in a direction adapted to receive an airflow generated by the fan module.

19. The method of claim 16, further including mounting another heat sink on the second side of the printed circuit board.

20. The method of claim 19, wherein mounting another heat sink on the second side of the printed circuit board further includes attaching the other heat sink on the second side to the heat dissipating member.

* * * * *